(12) United States Patent
Nishioka et al.

(10) Patent No.: US 10,879,033 B2
(45) Date of Patent: Dec. 29, 2020

(54) STAGE APPARATUS, AND CHARGED PARTICLE BEAM APPARATUS

(71) Applicant: HITACHI HIGH-TECH CORPORATION, Tokyo (JP)

(72) Inventors: Akira Nishioka, Tokyo (JP); Masaki Mizuochi, Tokyo (JP); Shuichi Nakagawa, Tokyo (JP); Tomotaka Shibazaki, Tokyo (JP); Hironori Ogawa, Tokyo (JP); Naruo Watanabe, Tokyo (JP); Motohiro Takahashi, Tokyo (JP); Takanori Kato, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/433,394

(22) Filed: Jun. 6, 2019

(65) Prior Publication Data

US 2019/0378678 A1    Dec. 12, 2019

(30) Foreign Application Priority Data

Jun. 7, 2018 (JP) .................................. 2018-109645

(51) Int. Cl.
*H01J 37/20* (2006.01)
*H01J 37/28* (2006.01)

(52) U.S. Cl.
CPC ............. *H01J 37/20* (2013.01); *H01J 37/28* (2013.01); *H01J 2237/2001* (2013.01); *H01J 2237/20235* (2013.01); *H01J 2237/20292* (2013.01)

(58) Field of Classification Search
CPC .. H01J 37/00; H01J 37/02; H01J 37/20; H01J 37/26
USPC ............................ 250/453.11, 306, 307, 311
See application file for complete search history.

(56) References Cited

U.S. PATENT DOCUMENTS

| 4,766,465 A | 8/1988 | Takahashi | |
|---|---|---|---|
| 6,252,705 B1* | 6/2001 | Lo | .............. G12B 5/00 |
| | | | 359/383 |
| 6,455,167 B1* | 9/2002 | Rigney | .................. C23C 28/00 |
| | | | 416/241 R |

(Continued)

FOREIGN PATENT DOCUMENTS

| JP | H7-142558 A | 6/1995 |
|---|---|---|
| JP | 2002-167291 A | 6/2002 |

*Primary Examiner* — Jason L McCormack
(74) *Attorney, Agent, or Firm* — Foley & Lardner LLP

(57) ABSTRACT

Provided is a stage apparatus that reduces thermal deformation and temperature rise in an upper table on which a sample is mounted and a charged particle beam apparatus including the stage apparatus. The stage apparatus includes: an upper stage that moves an upper table on which a sample is mounted in a first direction; a middle stage that moves a middle table on which the upper stage is mounted in a second direction orthogonal to the first direction; and a lower stage that moves a lower table on which the middle stage is mounted in a third direction orthogonal to the first direction and the second direction. The upper table and the middle table use a material having a smaller thermal expansion coefficient than in a material of the lower table, and the lower table uses a material having higher thermal conductivity than in the material of the upper table and the middle table.

10 Claims, 10 Drawing Sheets

(56) References Cited

U.S. PATENT DOCUMENTS

2003/0209324 A1* 11/2003 Fink .................. H01J 37/321
                                                           156/345.48
2004/0108067 A1* 6/2004 Fischione ............ G01N 1/28
                                                           156/345.38

* cited by examiner

STAGE APPARATUS, AND CHARGED PARTICLE BEAM APPARATUS

CLAIM OF PRIORITY

The present application claims priority from Japanese Patent Application JP 2018-109645 filed on Jun. 7, 2018, the content of which are hereby incorporated by references into this application.

TECHNICAL FIELD

The present invention relates to a stage apparatus and a charged particle beam apparatus using the stage apparatus, and more particularly to a stage apparatus capable of moving in three axial directions and suppressing deterioration of stage positioning accuracy caused by thermal deformation of the stage due to the heat generated by stage drive, and to the charged particle beam apparatus.

BACKGROUND ART

With the trend of miniaturization of semiconductor devices in recent years, there has been an increasing demand even for inspection and evaluation apparatuses in addition to manufacturing apparatuses, having high accuracy corresponding to the miniaturization. Apparatuses for measuring the geometry of a circuit formed on a semiconductor wafer include apparatuses using an electron microscope and such an apparatus is referred to as a Critical Dimension-Scanning Electron Microscope (critical dimension SEM). The conventional critical dimension SEM has been adapted mainly for dimension measurement within a plane of the wafer surface. With recent progress in multilayer structures of semiconductor devices, however, not only measurement within a plane but also dimension measurement in the depth direction has been required in semiconductor device inspections. Compared with an optical microscope, the electron microscope typically has a feature to be able to bring an imaging target with various depths into focus relatively globally. Still, this feature alone would not be sufficient to cope with the current situation. To handle this, at the time of imaging an object having variable depths on a wafer, it is effective to increase the acceleration voltage of the electron beam of the electron microscope and perform imaging with electrons in a high energy state. As a feature of the electron microscope, increasing the acceleration voltage of the electron beam increases the focal length up to the point where the electron beam is focused by a magnetic lens. Accordingly, in a case where the acceleration voltage is to be changed, the distance between the objective lens using the magnetic lens and the wafer needs to be changed. For this reason, in a critical dimension SEM having a function of changing the acceleration voltage, a stage apparatus that moves a wafer needs to include not merely a function of moving the wafer within a plane but also a function of moving the wafer in a direction perpendicular to the plane. Moreover, besides the critical dimension SEM, an inspection apparatus using a charged particle beam needs to enable a stage apparatus that moves a sample such as a wafer to be able to move in three axial directions, for a similar purpose.

Meanwhile, a charged particle beam emission apparatus such as an electron microscope needs to place a sample such as a wafer in a high-vacuum space in order to pass the charged particle. This leads to a state where a stage apparatus of the charged particle beam apparatus is placed in a high vacuum, with absence of convective heat transfer that would be present in the atmosphere. This causes a condition difficult for heat generated within the stage to be released to the outside, and this heat generation would increase the probability of temperature rise in the stage. The temperature rise occurring in each of components of the stage causes thermal expansion corresponding to the temperature rise, and the difference in expansion amount of each of the components and the constrained state of the assembled apparatus would lead to complicated thermal deformation of the stage. The thermal deformation of the stage directly leads to a positional error in wafer observation position determination by the stage. An increase in this positional error would make it difficult to identify an observed position in a circuit network of the semiconductor device formed in the nano-order precision. Therefore, it is necessary to suppress extremely minute thermal deformation in the stage to which the present invention is applied. Moreover, the thermal deformation causing the positional error of the wafer also includes thermal expansion of the wafer itself besides the thermal deformation of the stage. Accordingly, in order to suppress the thermal expansion of the wafer, it is also necessary to maintain the stage temperature constant at a position coming in contact with the wafer.

As an example of a stage technology against the problem of thermal deformation, there is a technology disclosed in PTL 1. The PTL 1 describes use of ceramic as the material of each of the base, the stage, the guide part, and the transmission part, mounted on the base. This technology describes alumina as a specific example of ceramic and that it is possible to achieve high accuracy by utilizing the characteristics that alumina has lower thermal conductivity and lower thermal expansion coefficient compared with metal such as aluminum.

Furthermore, as a material for use in a high precision stage, there is a technique disclosed in PTL 2. This PTL 2 describes the use of a metal-ceramic composite material using ceramic powder as a reinforcing material and aluminum or an aluminum alloy as a matrix material as a stage member, thereby solving the problem occurring in the use of an aluminum alloy or alumina.

CITATION LIST

Patent Literature

PTL 1: JP H7-142558 A
PTL 2: JP 2002-167291 A

SUMMARY OF INVENTION

Technical Problem

Since a ceramics material such as alumina has thermal conductivity lower than in a metal such as an aluminum alloy, forming the stage with this ceramic material would weaken the property to dissipate the heat generated inside the stage to the outside of the stage, leading to an occurrence of temperature rise in the stage. Ceramic materials such as alumina generally have a feature that linear expansion coefficient with respect to temperature is extremely small as compared with metal such as aluminum alloy. This small linear expansion coefficient would make it possible to suppress thermal deformation as compared with the case of using an aluminum alloy or the like, even with the increase in the temperature rise amount. This case, however, still involves an increase in the temperature rise amount, leading to a temperature rise in the wafer carried by the stage. This would generate thermal expansion of the wafer, making it difficult to improve the ultimate positional accuracy of the wafer.

Meanwhile, using a ceramic composite material using aluminum as the matrix material would make it possible to increase the thermal conductivity as compared with a ceramic material such as alumina and this can alleviate the above problem of an increase in the temperature rise amount.

Still, the thermal conductivity of the ceramic composite material is poorer than thermal conductivity of an aluminum alloy or the like formed of metal alone, and thus, the temperature rise amount of the stage using the ceramic composite material is greater as compared with the stage formed of aluminum alloy.

In addition, even with an attempt to design the stage having best of both features by combining various materials, there is always a contact portion between the different materials. This generates a difference in expansion rates between the materials in contact, causing thermal deformation including warping in the shape, leading to a failure in positional accuracy improvement.

Solution to Problem

In order to achieve the above object, the present invention provides a stage apparatus including: an upper stage that moves an upper table on which a sample is mounted in a first direction; a middle stage that moves a middle table on which the upper stage is mounted in a second direction orthogonal to the first direction; and a lower stage that moves a lower table on which the middle stage is mounted in a third direction orthogonal to the first direction and the second direction, in which the upper table and the middle table use a ceramic composite material containing aluminum as a matrix material, and the table of the lower stage includes a component using aluminum or an aluminum alloy. Furthermore, a table component of the middle stage and a guide mechanism that guides the middle stage in the moving direction are coupled with each other via a mechanism to reduce flexural rigidity in a rotational direction with respect to the moving axis, disposed between the table component and the guide mechanism. Furthermore, a mirror is installed in the upper table, and the position of the sample is identified on the basis of the distance measurement of the reflecting surface of the mirror, and the identified position of the sample is utilized for stage positioning control.

Another aspect of the present invention is a charged particle beam apparatus including the stage apparatus.

Advantageous Effects of Invention

According to the present invention, it is possible to provide a stage apparatus capable of identifying the position of a sample with high accuracy and a charged particle beam apparatus including this stage apparatus.

DESCRIPTION OF EMBODIMENTS

First Exemplary Embodiment

Figure 1:
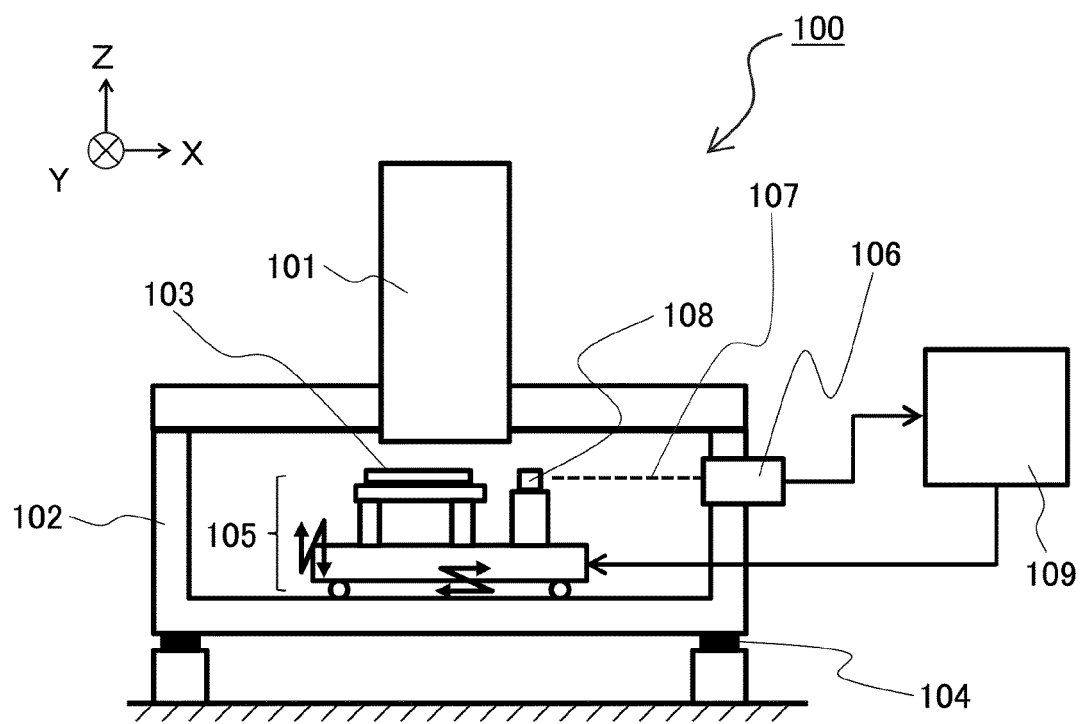
FIG. 1 is an overall schematic view of an example of a charged particle beam apparatus of the present invention.

Hereinafter, exemplary embodiments of a stage apparatus and a charged particle beam apparatus according to the present invention will be described below with reference to the drawings. The stage apparatus according to the present invention includes: an upper stage that moves an upper table on which a sample is mounted in a first direction; a middle stage that moves a middle table on which the upper stage is mounted in a second direction orthogonal to the first direction; and a lower stage that moves a lower table on which the middle stage is mounted in a third direction orthogonal to the first direction and the second direction. In the present exemplary embodiment, the first direction will be described as a Z-direction, the second direction as a Y-direction, and the third direction as an X-direction. In the following description and drawings, the same reference numerals are given to constituents having a same functional configuration, and redundant description will be omitted.

FIG. 1 is an overall schematic view of a charged particle beam apparatus 100. The charged particle beam apparatus 100 includes an electron optical system lens barrel 101 and a sample chamber 102. The electron optical system lens barrel 101 emits an electron beam to a sample 103, that is, a wafer arranged in the sample chamber 102, for example, detects secondary electrons or reflected electrons emitted from the sample 103, and outputs a detection signal. An image obtained by converting the output detection signal is used for measurement of the line width of a pattern on the sample 103 and evaluation of shape accuracy. In FIG. 1, the electron beam emission direction is defined as the Z-direction. In order to direct the electron beam to the sample 103 without causing collision of the electron beam with gas molecules, the interior of the sample chamber 102 is maintained in a vacuum state.

The sample chamber 102 is supported by an anti-vibration mount 104. The sample chamber 102 internally includes a stage apparatus 105 that is movable in the X-direction and the Y-direction being directions orthogonal to the Z-direction, and movable in the Z-direction and on which the sample 103 is mounted. The position of the stage apparatus 105 is measured by emitting laser light 107 from a laser interferometer 106 provided in the sample chamber 102 to a mirror 108 provided in the stage apparatus 105. On the basis of the measurement result, a controller 109 controls the position of the stage apparatus 105.

Figure 2:
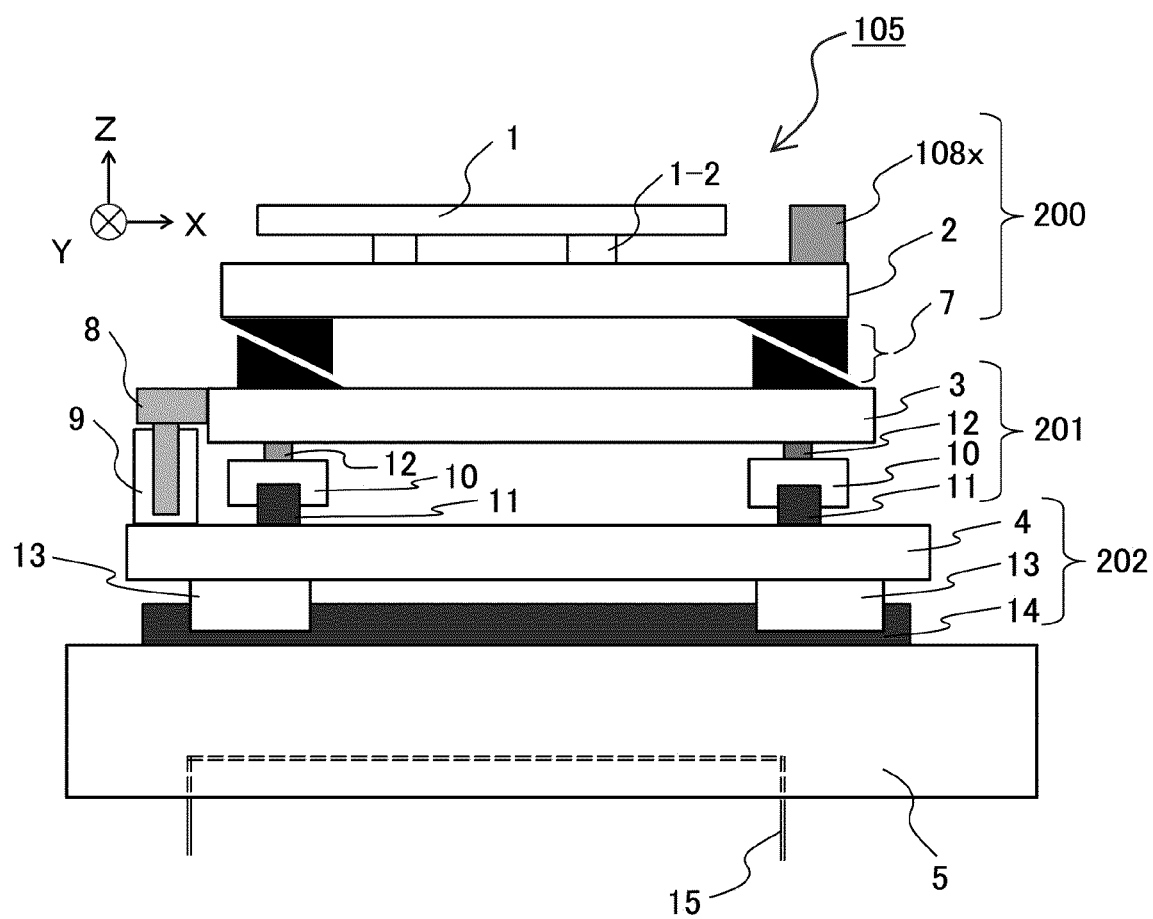
FIG. 2 is a front view of an example of a stage apparatus of a first exemplary embodiment.
Figure 3:
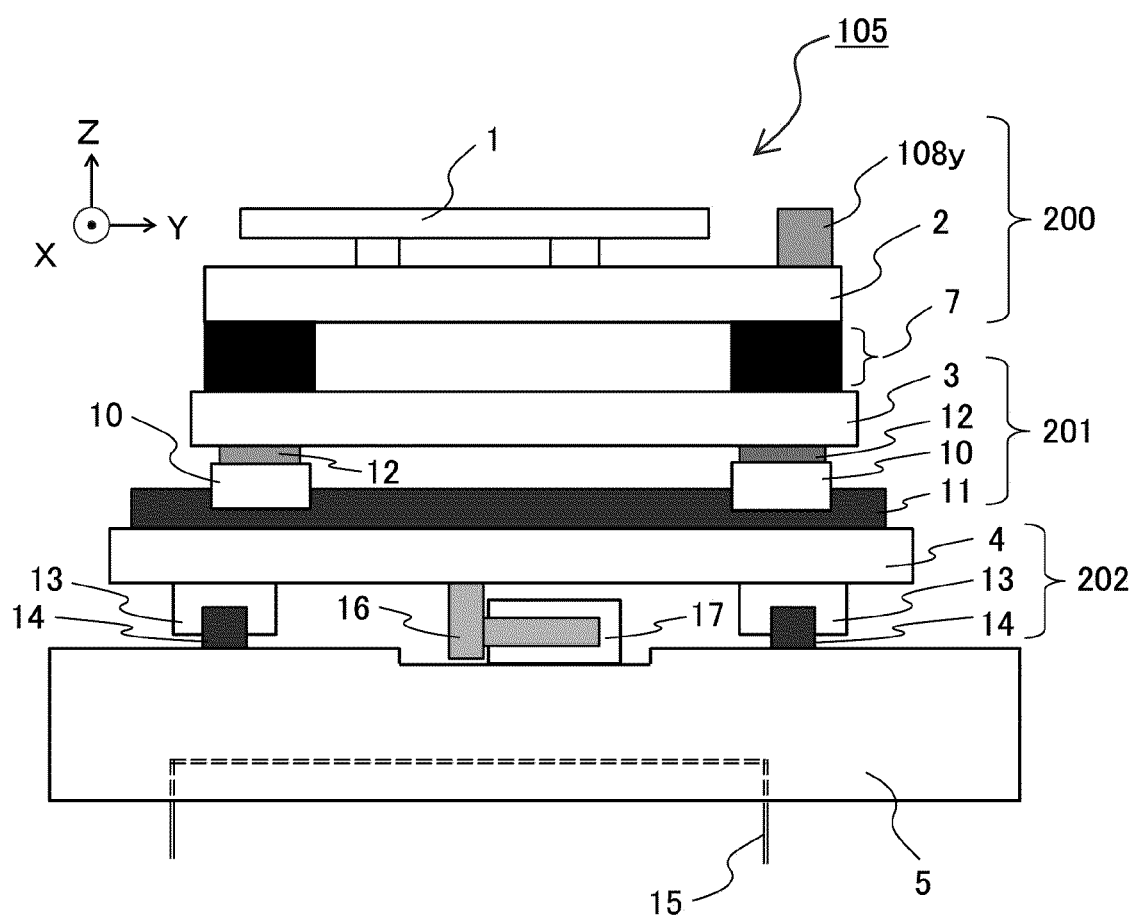
FIG. 3 is a side view of an example of the stage apparatus of the first exemplary embodiment.

The stage apparatus 105 of the present exemplary embodiment will be described with reference to FIGS. 2 and 3. FIG. 2 is a front view, and FIG. 3 is a view obtained by shifting observation direction by 90 degrees from FIG. 2, namely, a side view. The stage apparatus 105 includes: an upper stage 200 movable in the Z-direction; a middle stage 201 movable in the Y-direction; a lower stage 202 movable in the X-direction; and a base portion 5, the stages being stacked in the Z-direction. The interior of the sample chamber 102 is maintained in a vacuum state. Accordingly, heat generated in each of portions of the stage apparatus 105 is transferred from each of the stages to a lower stage, so as to be released to the outside of the stage apparatus 105 via the base portion 5. Each of portions will be described below.

First, the upper stage 200 will be described. The upper stage 200 includes a chuck 1, a support 1-2, an upper table 2, and an actuator 7.

The chuck 1 is a flat plate spreading over an X-Y plane, and stabilizes the wafer as a sample. The stabilization of the sample uses electrostatic force, for example. The sample is stabilized with an electrostatic force to hold the sample without shifting even when the stage apparatus 105 moves. The material of the chuck 1 is preferably a material having a small thermal expansion coefficient, low thermal conductivity, non-electricity, and high hardness. Examples of the applicable material include alumina. Using a material such as alumina as the chuck 1 enables suppression of thermal deformation of the sample and heat transfer to the sample.

The upper table 2 is a flat plate spreading over the X-Y plane. The chuck 1 is arranged on the upper table 2. The upper table 2 preferably uses a material having a small thermal expansion coefficient, low thermal conductivity, high Young's modulus/density. Examples of the applicable material include a ceramic composite material. The ceramic composite material preferably uses aluminum as a matrix material. Using a material such as a ceramics composite material for the upper table 2 would suppress thermal deformation of the chuck 1 and heat transfer to the sample. Although the thermal expansion of the chuck 1 and the upper table 2 is small, there is a difference in thermal expansion due to their difference in the material, and its influence is remarkable in the X-Y plane. To handle this, the chuck 1 and the upper table 2 are connected to each other via the support 1-2 so as to limit a region to be influenced by the difference in thermal expansion. Furthermore, deformation of the support 1-2 would prevent distortion of the chuck 1 and distortion of the sample.

Moreover, mirrors 108x and 108y used for measuring the position of the stage apparatus 105 are also provided on the upper table 2. Specifically, the mirror 108x is used for measuring the position in the X-direction, while the mirror 108y is used for measuring the position in the Y-direction. The use of a material such as a ceramic composite material for the upper table 2 can suppress the positional deviation of the mirrors 108x and 108y, leading to position control with high accuracy.

The actuator 7 functions as a driving unit that generates a driving force to move the upper table 2 in the Z-direction and is provided between the upper table 2 and the middle stage 201. Since the actuator 7 generates heat, each of four actuators 7 is disposed at four corners of the upper table 2 in the present exemplary embodiment. With such an arrangement, the heat transfer path from the actuator 7 to the sample is extended, making it possible to suppress heat transfer to the sample. Details of the actuator 7 will be described below with reference to FIG. 7. While the present exemplary embodiment uses a configuration having four actuators 7, it is possible to use the number other than four in the configuration.

Next, the middle stage 201 will be described. The middle stage 201 includes a middle table 3, a middle slide part 10, a middle rail part 11, and a connecting part 12.

The middle table 3 is a flat plate spreading over the X-Y plane. The actuator 7 is fixed to the middle table 3, and the upper stage 200 is mounted on the middle table 3. Similarly to the upper table 2, the middle table 3 preferably uses a material having a small thermal expansion coefficient, a low thermal conductivity, and a high Young's modulus/density. For example, a ceramic composite material is used as a material of the middle table 3. Using a material such as a ceramic composite material for the middle table 3 would suppress thermal deformation of the upper stage 200 and heat transfer to the upper stage 200. Since the middle table 3 and the upper table 2 uses the same material, their thermal expansion is equal and thus, thermal deformation of the middle table 3 and the upper table 2 can be suppressed.

The middle slide part 10 functions as a guide part that limits the moving direction of the middle table 3 together with the middle rail part 11. The middle slide part 10 includes a rolling element so as to be able to slide on the middle rail part 11. In the present exemplary embodiment, each of the four middle slide parts 10 is disposed at four corners of the middle table 3. Note that since the middle slide part 10 is a portion of the heat transfer path to the lower stage 202, the middle slide part 10 is preferably disposed within a range of a predetermined distance from the actuator 7. Furthermore, it is more preferable that the middle slide part 10 and the actuator 7 are arranged to be aligned in the Z-direction. With such an arrangement, it is possible to reduce the transfer path of heat generated by the actuator 7 to the lower stage 202, enabling suppression of the temperature rise in the middle table 3.

The middle rail part 11 is arranged on the lower stage 202 in the Y-direction. The middle slide part 10 and the middle rail part 11 preferably use a material having high hardness and that can be processed with high accuracy. For example, a steel material is used for these parts. With the configuration in which the middle slide part 10 slides on the middle rail part 11 arranged in the Y-direction, the moving direction of the middle table 3 is restricted to the Y-direction. That is, the middle table 3 is guided in the Y-direction by the middle slide part 10 and the middle rail part 11.

The connecting part 12 is disposed between the middle table 3 and the middle slide part 10 and connects the middle table 3 and the middle slide part 10 while limiting the deformation direction of the middle slide part 10. Details of the connecting part 12 will be described below with reference to FIGS. 4 to 6.

The middle table 3 is also connected with a movable member 8 of the middle linear motor. The movable member 8 moves over the stator 9 of the middle linear motor fixed to the lower stage 202, whereby the middle table 3 is driven in the Y-direction. In the present exemplary embodiment, the movable member 8 is constituted by a coil component, and the stator 9 is constituted by a magnetic component. With such a configuration, the weight of the middle table 3 side can be reduced, enhancing the controllability of the operation of the middle table 3. Note that a material having a low thermal conductivity may be interposed between the movable member 8 and the middle table 3 in order to suppress transmission of the heat generated on the movable member 8 constituted by the coil components to the middle table 3.

Next, the lower stage 202 will be described. The lower stage 202 includes a lower table 4, a lower slide part 13, and a lower rail part 14.

The lower table 4 is a flat plate spreading over the X-Y plane. The middle rail part 11 is fixed to the lower table 4, and the middle stage 201 is mounted on the lower table 4. The lower table 4 is preferably formed of a material having high thermal conductivity and light weighted. For example, aluminum or an aluminum alloy is used as the material of the lower table 4. Using a material such as aluminum alloy for the lower table 4 makes it possible to transfer heat generated by the middle stage 201 and the upper stage 200 with a smaller temperature difference.

The lower slide part 13 functions as a guide part that limits the moving direction of the lower table 4 together with the lower rail part 14. The lower slide part includes a rolling element to enable sliding on the lower rail part 14. In the present exemplary embodiment, each of the four lower slide parts 13 is disposed at four corners of the lower table 4.

The lower rail part 14 is arranged on the base portion 5 in the X-direction. The lower slide part 13 and the lower rail part 14 are preferably formed of a material having high hardness and that can be processed with high accuracy. For example, a steel material is used for these parts. With the configuration in which the lower slide part 13 slides over the lower rail part 14 arranged in the X-direction, the moving direction of the lower table 4 is restricted to the X-direction. That is, the lower table 4 is guided in the X-direction by the lower slide part 13 and the lower rail part 14.

The lower table 4 is also connected with a movable member 16 of the lower linear motor. The movable member 16 moves over the stator 17 of the lower linear motor fixed to the base portion 5, whereby the lower table 4 is driven in the X-direction.

Next, the base portion 5 will be described. The base portion 5 is a portion of the sample chamber 102. The lower rail part 14 is fixed to the base portion 5, and the lower stage 202 is mounted on the base portion 5. The base portion 5 is preferably formed of a material having high thermal conductivity and light weighted. For example, aluminum or an aluminum alloy is used as the material of the lower table 4. It is preferable that the base portion 5 be formed of the same material as that of the lower table 4. Using the same material for these portions can suppress thermal deformation caused by a difference in thermal expansion.

A cooling pipe 15 is provided inside the base portion 5. The interior of the sample chamber 102 is maintained at a predetermined temperature by coolant flowing within the cooling pipe 15. Using a material having a high thermal conductivity such as an aluminum alloy for the base portion 5 enables heat generated by the stage apparatus 105 to be transferred with a smaller temperature difference, making it possible to suppress thermal deformation caused by the temperature difference.

As described above, the stage apparatus 105 of the present exemplary embodiment uses ceramic composite materials for the upper table 2 and the middle table 3, and uses aluminum or an aluminum alloy for the lower table 4. That is, each of the upper table 2 and the middle table 3 uses a material having a thermal expansion coefficient smaller than the thermal expansion coefficient of the material of the lower table 4. The lower table 4 uses a material having thermal conductivity higher than the thermal conductivity of the material of the upper table 2 and the middle table 3. With such a configuration, the upper table 2 and the middle table 3 have small and equal thermal expansion, while the heat generated by the stage apparatus 105 is released to the outside of the stage apparatus 105 via the lower stage 202 including the lower table 4. This results in reduction of thermal deformation and temperature rise of the upper table 2 on which the sample 103 is mounted.

Figure 4:
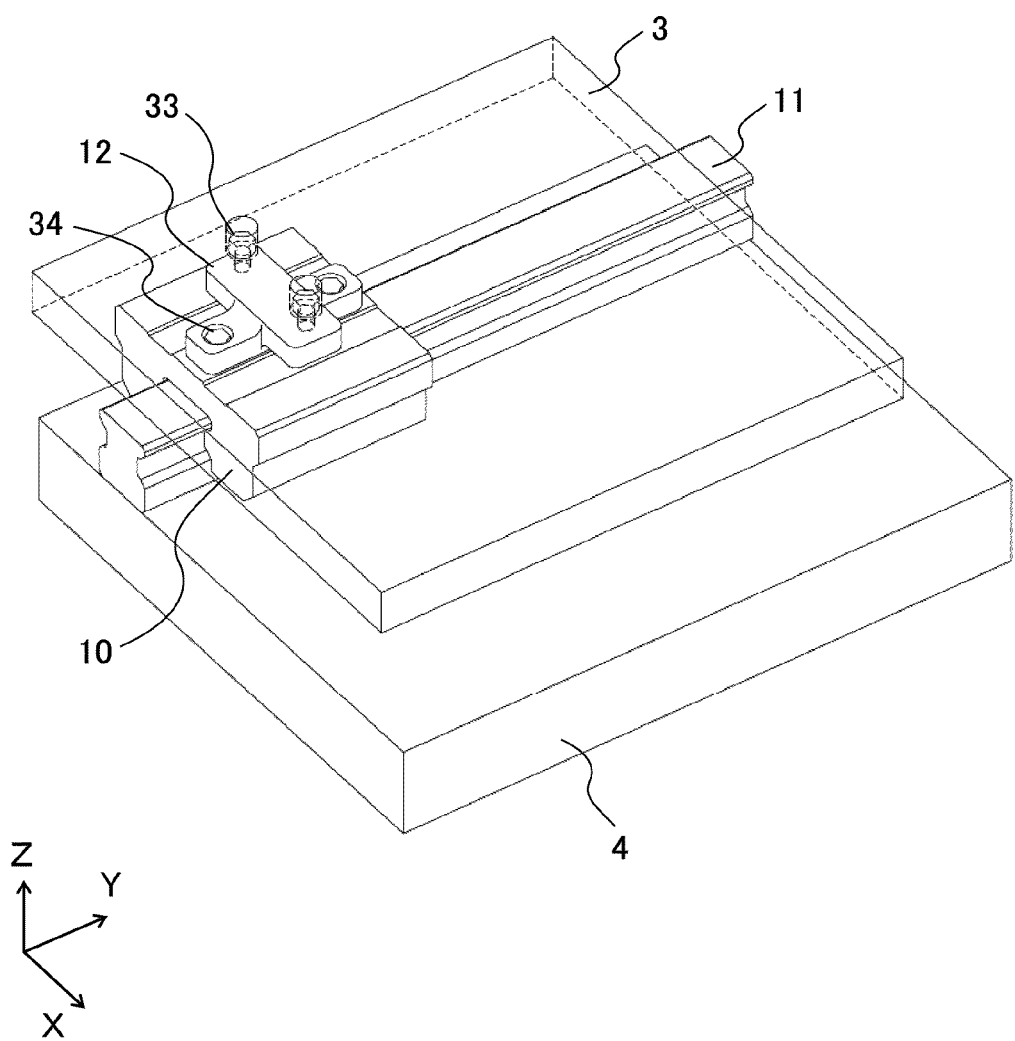
FIG. 4 is a perspective view illustrating an example of a connecting part of the first exemplary embodiment.
Figure 5:
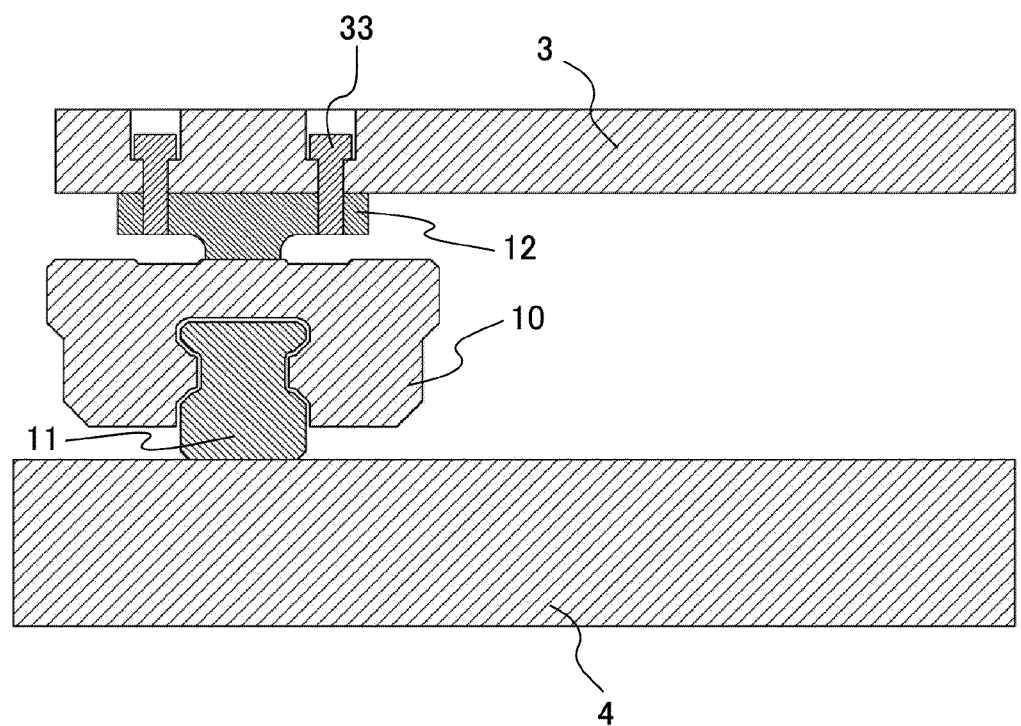
FIG. 5 is a cross-sectional view illustrating an example of the connecting part of the first exemplary embodiment before deformation.
Figure 5:
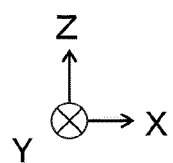
Figure 6:
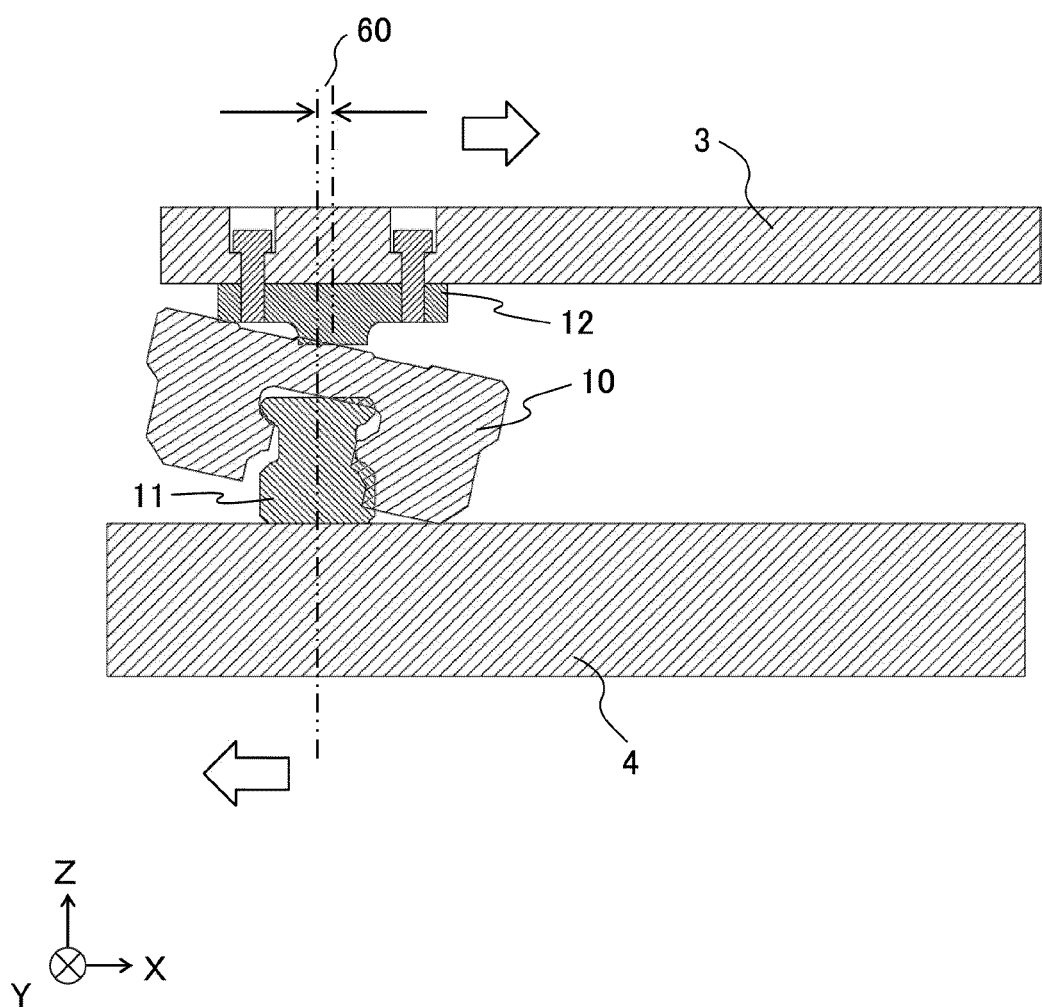
FIG. 6 is a cross-sectional view illustrating an example of the connecting part of the first exemplary embodiment after deformation.

The connecting part 12 will be described with reference to FIGS. 4 to 6. FIG. 4 is a perspective view and partially includes a see-through view in order to facilitate understanding of the structure. FIGS. 5 and 6 are cross-sectional views taken along X-Z plane, respectively indicating states before and after the middle slide part 10 is deformed. FIG. 6 is an enlarged schematic view illustrating actual deformation. FIGS. 4 to 6 are views illustrating one of the four connecting parts 12.

The connecting part 12 is a member connecting the middle table 3 with the middle slide part 10 such that the rigidity against deformation of the middle slide part 10 with a rotational axis in the Y-direction is lower than the rigidity against deformation of the middle slide part 10 with the rotational axis in the X-direction and the Z-direction. The connecting part 12 is fixed to the middle table 3 by a screw 33 and fixed to the middle slide part 10 by a screw 34. A surface of the connecting part 12 coming in contact with the middle slide part 10 has a shape longer in the Y-direction than in the X-direction.

As described above, the middle table 3 has a thermal expansion coefficient smaller than in the lower table 4. Accordingly, when the temperature of the stage apparatus 105 rises, the thermal expansion amount becomes larger in the lower table 4 than in the middle table 3. As a result, the middle table 3 is relatively displaced in the −X-direction and the lower table 4 is relatively displaced in the +X-direction as indicated by arrows in FIG. 6, leading to a displacement difference 60 generated between the tables. In order to handle this generation of displacement, the middle table 3 and the middle slide part 10 are connected via the connecting part 12. Accordingly, the middle slide part 10 is inclined about the rotational axis in the Y-direction, and the displacement difference 60 is absorbed by this inclination.

Note that the middle slide part 10 is in contact with the middle rail part 11 via rolling elements with a small contact area between the middle slide part 10 and the middle rail part 11. Accordingly, a reaction force against the inclination of the middle slide part 10 about the rotational axis in the Y-direction is relatively small. This makes it possible to avoid table bending deformation due to the displacement difference 60. Additionally, the displacement difference in the Y-direction between the middle table 3 and the lower table 4 would not cause table bending deformation since the middle table 3 and the lower table 4 are movable relatively in the Y-direction.

Figure 7:
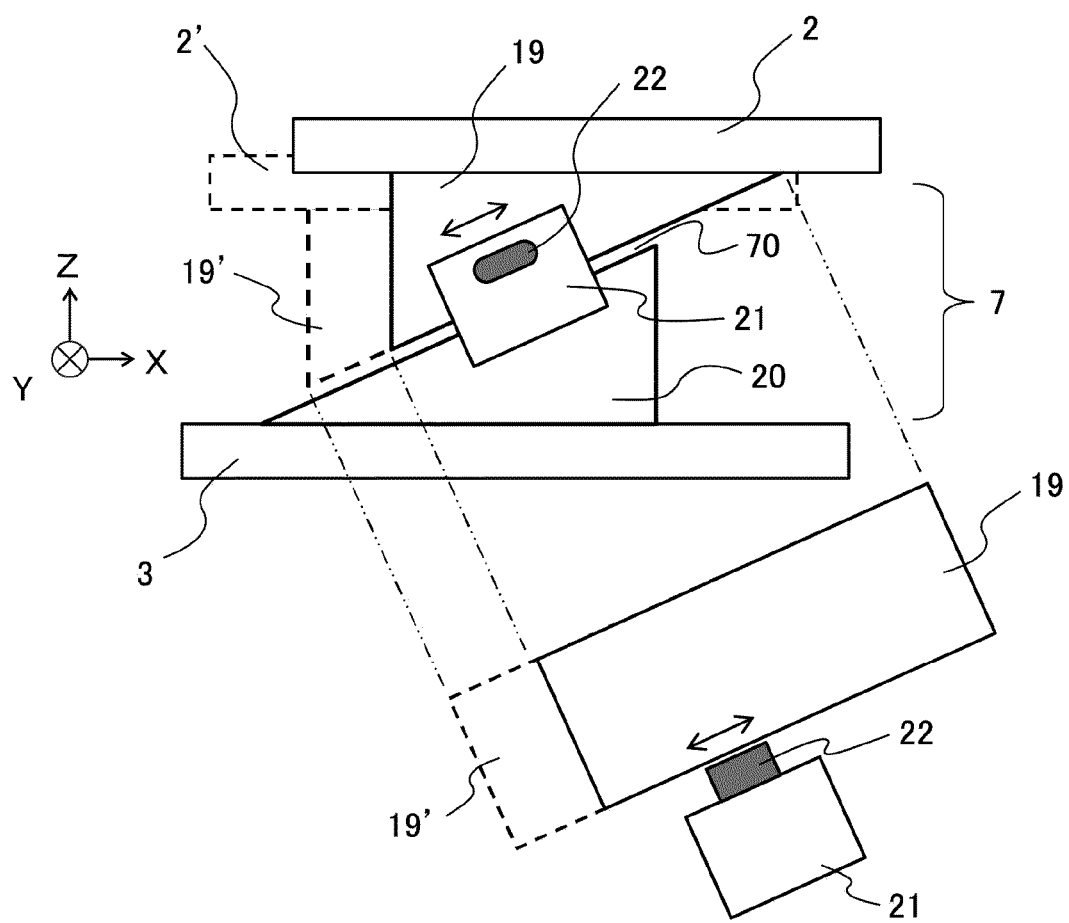
FIG. 7 is a view illustrating an example of an actuator of the first exemplary embodiment.

The actuator 7 will be described with reference to FIG. 7. The upper illustration of FIG. 7 is a view seen from the same direction as FIG. 2, while the lower illustration linked by a two-dot chain line is a view projected in the direction of the two-dot chain line. The actuator 7 includes an upper slope portion 19, a lower slope portion 20, and an ultrasonic motor 21.

The upper slope portion 19 includes a slope inclined with respect to the X-Y plane and is fixed to the upper table 2. The lower slope portion 20 includes a slope inclined with respect to the X-Y plane, and is fixed to the middle table 3. The upper slope portion 19 is arranged above the lower slope portion 20 so as to be slidable along a sliding surface 70, and the movement of the upper slope portion 19 in the Y-direction is restricted. A rolling element may be interposed on the sliding surface 70.

The ultrasonic motor 21 is fixed to the lower slope portion 20 and generates high-speed vibration in an internal oscillator and thereby drives the arm 22 in the direction of the double arrow in the drawing. The arm 22 is in pressing contact with the upper slope portion 19, and driving of the arm 22 moves the upper slope portion 19 along the sliding surface 70. The upper table 2 moves together with the upper slope portion 19 and moves from the position of 2' and 19' to the position 2 and 19, for example. Since the upper table 2 moves together with the upper slope portion 19, it is possible to control the position of the upper table 2 in the Z-direction. Note that the amount of movement of the upper table 2 in the X-direction is canceled out by the movement of the lower table 4. In addition, while the present exemplary embodiment is a case where the upper slope portion 19 moves in the X-direction, the actuator may be installed in a direction to move in the Y-direction by changing the installation direction by 90°. In that case, the amount of movement in the Y-direction in order to move in the Z-direction is to be canceled out by the movement of the middle table in the opposite direction.

Fixing the ultrasonic motor 21 to the lower slope portion 20 makes it possible to suppress direct transfer of the generated heat in the ultrasonic motor 21 to the upper table 2. Furthermore, interposing the rolling element on the sliding surface 70 makes it possible to reduce the friction on the sliding surface 70, leading to reduction of the load of the ultrasonic motor 21 and frictional heat. Additionally, interposing the rolling element can reduce the contact area on the sliding surface 70, making it possible to suppress heat transfer through the sliding surface 70. As described above, with the use of the actuator 7 illustrated in FIG. 7, it is possible to suppress the temperature rise in the upper table 2.

Comprehensive application of the above-described configuration enables use of a same material for the upper table and the middle table, making it possible to prevent thermal deformation caused by the difference in the expansion rate of the tables. In addition, prevention of thermal deformation can maintain the shape of the upper stage, also enabling prevention of inclination of the mirror installed on the upper stage. In execution of position measurement, using a laser interferometer and emitting the laser onto the mirror to be reflected on it and generating interference between the reflected light and the incident light would achieve high-accuracy distance measurement. However, at that time, a slight inclination occurring on the reflecting surface of the mirror might change the distance being measured and the amount of change leads to a positional error of the stage. Therefore, causing the upper table and the middle table to have the same expansion rate to prevent deformation of the upper table would make it possible to enhance the positional accuracy of the stage through prevention of inclination of the mirror installed on the upper table.

Meanwhile, even with the same material used for the upper table and the middle table, using a material with a higher linear expansion coefficient such as an aluminum alloy might generate a difference in the expansion amount due to a slight temperature difference between the upper table and the middle table, leading to warping deformation of the upper stage. On the other hand, using ceramic materials such as alumina to equalize both materials would increase the temperature rise to generate wafer thermal expansion even though thermal deformation can be suppressed. In order to handle this dilemma, the ceramic composite material containing aluminum as a matrix material is used to enable the use of the same material for the upper table and the middle table, and this can ultimately solve the above problem.

Moreover, the stage apparatus installed in a vacuum cannot dissipate heat via the air and thus, heat dissipation is achieved by solid thermal conduction alone. Within the stages vertically opposed with each other, the guide mechanism alone is in a solid contact position, and therefore, heat dissipation is performed through the guide mechanism. Accordingly, in a case where the stage apparatus includes three stages, namely upper, middle, and lower stages, the heat generated in the upper stage is transmitted to the middle stage through the guide mechanism, and then, the middle stage transfers the total of the heat generated to move the middle stage and the heat transmitted from the upper stage, to the lower stage. Furthermore, the lower stage transfers the heat generated in all three stages, namely, the upper, middle, and lower stage, to the base portion through the guide mechanism. Therefore, it is possible to further reduce the temperature rise in the lower stage by using an aluminum alloy having a thermal conductivity higher than in the ceramic composite material for the table component of the lower stage having the largest amount of heat transfer. Moreover, suppressing the temperature rise in the lower stage leads to a decrease in the temperatures of the middle stage and the upper stage installed on the lower stage. This configuration ultimately enables prevention of the temperature rise in the wafer and suppression of the thermal expansion of the wafer.

In the use of the above configuration, the difference in the materials used for the middle table and the lower table leads to a possibility of occurrence of stage warping due to their difference in linear expansion coefficient. To handle this, the configuration includes a mechanism for reducing flexural rigidity interposed between the guide mechanism of the middle stage and the middle table. This configuration can suppress the warping due to the difference in expansion between the middle table and the lower table. In other words, in a case where the lower table is further expanded because it is formed of an aluminum alloy, the spacing of the rails fixed to the lower table will be further widened, while the middle table linked with it will not be widened so much. The widened spacing of the guide rails leads to widened spacing of the slide component restrained by the guide rails, and this displacement generates the force to widen the middle table. Fortunately, however, the component between the slide component and the middle table is deformed in the rotation direction with respect to the guide axis, enabling the displacement in the slide component to be absorbed. This reduces the force of widening the middle table, enabling suppression of the bending of the middle table. In addition, concerning a portion in which thermal deformation of the middle table could not be suppressed with this mechanism alone, a mechanical component is interposed between the upper table and the middle table to enable absorption of deformation at this portion. As a result, bending of the upper table is reduced to a satisfactory level. These lead to suppression of the thermal deformation caused by the use of different materials in combination and suppression of bending of the table on which the mirror is installed. This reduces a slight angular change in the reflecting surface of the mirror, leading to improvement in accuracy in distance measurement of the reflecting surface. This improves sample position identification accuracy, leading to achievement of a stage apparatus capable of high-accuracy positioning control and achievement of a high-accuracy charged particle beam apparatus.

Second Exemplary Embodiment

In the first exemplary embodiment, the configuration illustrated in FIG. 7 as the actuator 7 that moves the upper table 2 in the Z-direction has been described. The actuator that moves the upper table 2 in the Z-direction is not limited to the configuration illustrated in FIG. 7, and thus, other configurations will be described in the present exemplary embodiment.

Figure 8:
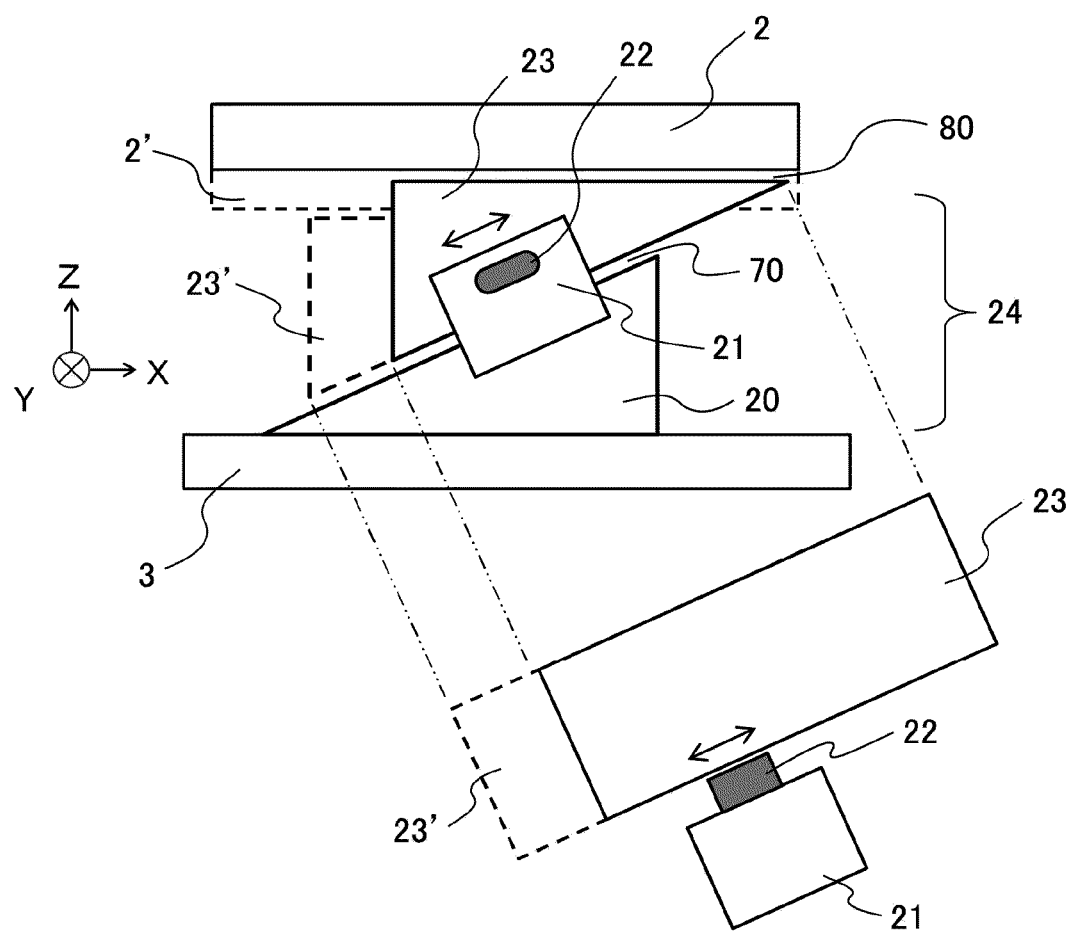
FIG. 8 is a view illustrating an example of an actuator of a second exemplary embodiment.

With reference to FIG. 8, an actuator 24 that moves the upper table 2 in the Z-direction will be described in comparison with FIG. 7. FIG. 8 includes an upper slope portion 23 that replaces the upper slope portion 19 of FIG. 7. Furthermore, the present exemplary embodiment includes an additional member (not illustrated) for limiting the movement of the upper table 2 in the X-direction.

The upper slope portion 23 has a slope inclined with respect to the X-Y plane and is not fixed to the upper table 2. The upper slope portion 23 comes in contact with the upper table 2 via a sliding surface 80. Note that the configuration in which the upper slope portion 23 is slidable over the lower slope portion 20 along the sliding surface 70, the movement in the Y-direction is restricted, and the ultrasonic motor 21 is fixed to the lower slope portion 20 is the same as the configuration of the first exemplary embodiment.

Together with the driving of the arm 22 of the ultrasonic motor 21, the upper slope portion 23 moves along the sliding surface 70, for example, moves from a position 23' to a position 23. Together with the movement of the upper slope portion 23, the upper table 2 moves in the Z-direction while sliding on the sliding surface 80, for example, moves from a position 2' to a position 2. The configuration illustrated in FIG. 8 eliminates necessity of the movement of the lower table 4, further facilitating the position control as compared to the first exemplary embodiment.

Figure 9:
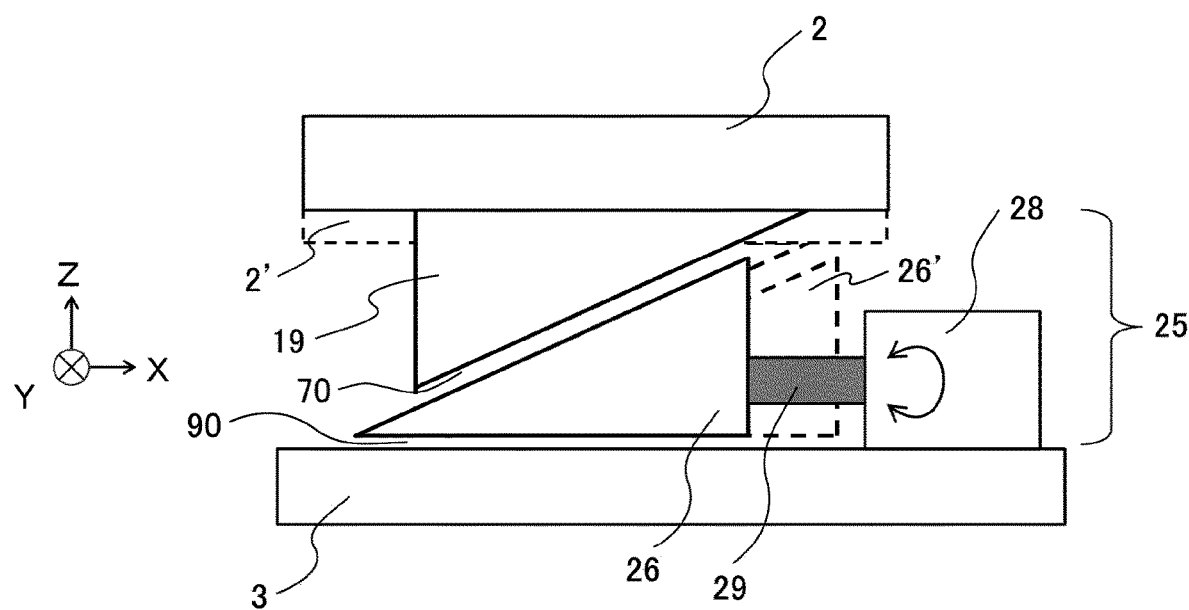
FIG. 9 is a view illustrating another example of the actuator of the second exemplary embodiment.

With reference to FIG. 9, an actuator 25 that moves the upper table 2 in the Z-direction will be described in comparison with FIG. 7. FIG. 9 includes a lower slope portion 26 that replaces the lower slope portion 20 of FIG. 7, and further includes a motor 28 and a screw shaft 29 to replace the ultrasonic motor 21. Furthermore, the present exemplary embodiment includes an additional member (not illustrated) for limiting the movement of the upper table 2 in the X-direction.

The lower slope portion 26 has a slope inclined with respect to the X-Y plane and is not fixed to the middle table 3. The lower slope portion 26 comes in contact with the middle table 3 via a sliding surface 90. Note that the configuration in which the upper table 2 is fixed to the upper slope portion 19 and the upper slope portion 19 is arranged on the lower slope portion 26 slidably along the sliding surface 70 and the movement in the Y-direction is restricted is the same as the configuration of the first exemplary embodiment.

The motor 28 is fixed to the middle table 3 and is connected to the lower slope portion 26 via the screw shaft 29. The motor 28 and the screw shaft 29 constitute a ball screw mechanism. The rotational motion of the motor 28 is translated into linear motion of the screw shaft 29, whereby the lower slope portion 26 moves in the X-direction, for example, moves from a position 26' to a position 26. Together with the movement of the lower slope portion 26, the upper table 2 fixed to the upper slope portion 19 moves in the Z-direction, for example, moves from a position 2' to a position 2.

The configuration illustrated in FIG. 9 eliminates necessity of the movement of the lower table 4, further facilitating the position control as compared to the first exemplary embodiment. Furthermore, since the motor 28 is fixed to the middle table 3, it is possible to prevent direct transfer of the heat generated by the motor 28 to the upper table 2.

Third Exemplary Embodiment

The first exemplary embodiment has described the configuration in which the movable member 8 of the middle stage linear motor connected to the middle table 3 is a coil component, and the stator 9 of the middle linear motor fixed to the lower stage 202 is a magnetic component. The present exemplary embodiment will describe a configuration in which these components are exchanged with each other.

Figure 10:
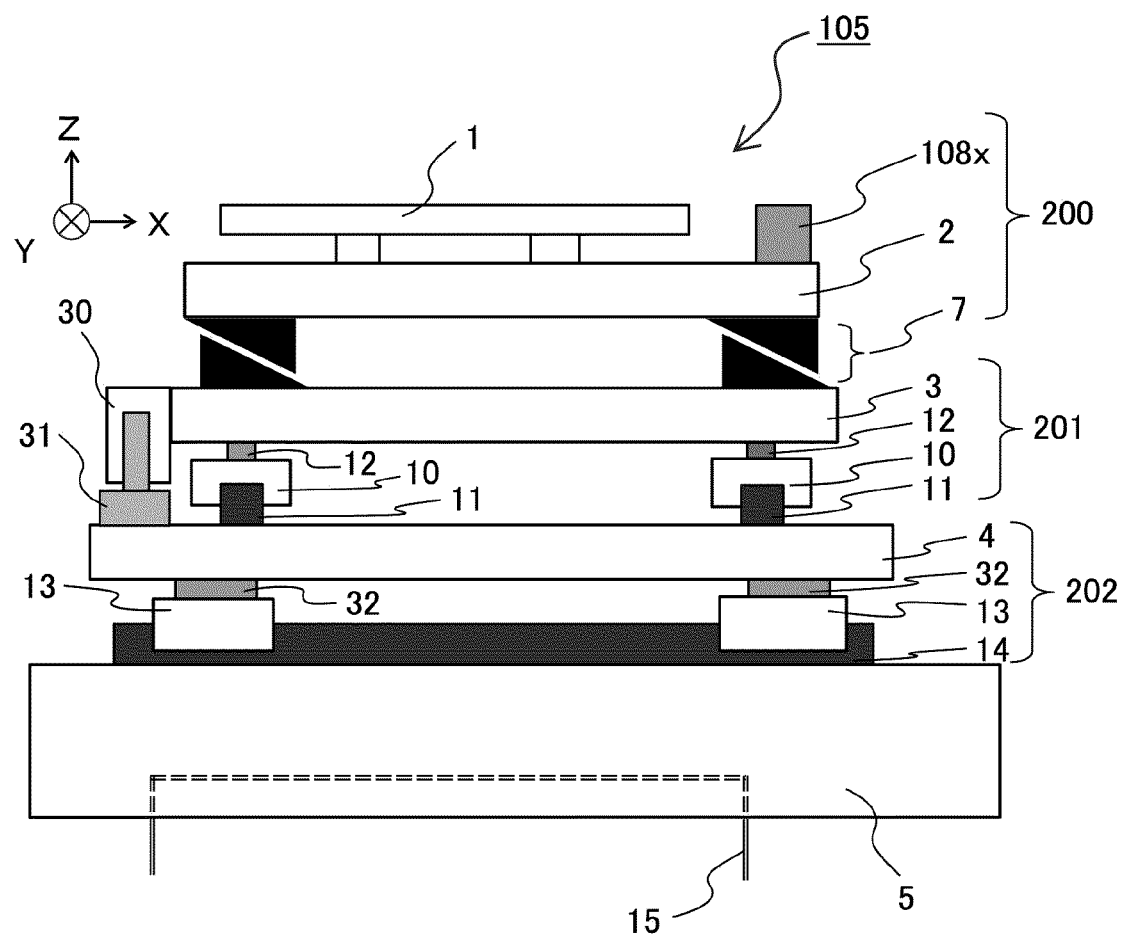
FIG. 10 is a front view of an example of a stage apparatus according to a third exemplary embodiment.

The exemplary embodiment will be described with reference to FIG. 10. In the present exemplary embodiment, a movable member 30 of the middle linear motor connected to the middle table 3 is a magnetic component, while a stator 31 of the middle linear motor fixed to the lower stage 202 is a coil component. With such a configuration, it is possible to suppress transfer of generated heat at the stator 31 constituted by the coil component to the middle table 3, enabling reduction of the temperature rise in the middle table 3.

Moreover, the present exemplary embodiment may further include, between the lower table 4 and the lower slide part 13, a connecting part 32 for connecting these parts. The connecting part 32 is a member connecting the lower table 4 with the lower slide part 13 such that the rigidity against deformation of the lower slide part 13 with a rotational axis in the Y-direction is lower than the rigidity against deformation of the lower slide part 13 with the rotational axis in the X-direction and the Z-direction. A surface of the connecting part 32 coming in contact with the lower slide part 13 has a shape longer in the X-direction than in the Y-direction.

The lower table 4 and the lower slide part 13 are connected to each other by the connecting part 32. Accordingly, even when there is a displacement difference in the Y-direction between the lower table 4 and the base portion 5, the lower slide part 13 is inclined about a rotational axis in the X-direction. This inclination makes it possible to absorb the displacement difference in the Y-direction.

While a plurality of exemplary embodiments has been described as above, the stage apparatus 105 and the charged particle beam apparatus 100 according to the present invention are not limited to the above-described exemplary embodiments, and may be implemented with modified constituents without departing from the scope of the invention. Furthermore, a plurality of constituents disclosed in the above exemplary embodiments may be appropriately combined with each other. Furthermore, some constituents may be deleted from all the constituents described in the above exemplary embodiments.

REFERENCE SIGNS LIST 1 chuck
2 upper table
3 middle table
4 lower table
5 base portion
7 actuator
8 movable member of middle linear motor
9 stator of middle linear motor
10 middle slide part
11 middle rail part
12 connecting part
13 lower slide part 13
14 lower rail part 15 cooling pipe
16 movable member of lower linear motor
17 stator of lower linear motor
19 upper slope portion
20 lower slope portion
21 ultrasonic motor
22 arm
23 upper slope portion
24 actuator
25 actuator
26 lower slope portion
28 motor
29 screw shaft
30 movable member of middle linear motor
31 stator of middle linear motor
32 connecting part
33 screw
34 screw
60 displacement difference
70 sliding surface
80 sliding surface
90 sliding surface
100 charged particle beam apparatus
101 electron optical system lens barrel
102 sample chamber
103 sample
104 anti-vibration mount
105 stage apparatus
106 laser interferometer
107 laser light
108 mirror
108x mirror
108y mirror
109 controller

The invention claimed is:

1. A stage apparatus comprising:
an upper stage arranged to move an upper table on which a sample is mounted in a first direction;
a middle stage arranged to move a middle table on which the upper stage is mounted in a second direction orthogonal to the first direction; and
a lower stage arranged to move a lower table on which the middle stage is mounted in a third direction orthogonal to the first direction and the second direction,
wherein the upper table and the middle table use a material having a smaller thermal expansion coefficient than in a material of the lower table, the material of the upper table and the middle table being a same material, and
the lower table uses a material having a higher thermal conductivity than in the material of the upper table and the middle table.

2. The stage apparatus according to claim 1,
wherein the upper stage includes:
a mirror having a reflecting surface in the second direction; and
a mirror having a reflecting surface in the third direction, and arranged to provide a distance measurement of the reflecting surfaces of the mirrors to obtain a position of a sample mounted on the upper table.

3. The stage apparatus according to claim 1,
wherein the middle stage includes:
a guide part arranged to guide the middle table in the second direction; and
a connecting part arranged to connect the middle table and the guide part with each other, and
the connecting part is configured such that rigidity against deformation of the connecting part with the guide part with a rotational axis in the second direction is lower than the rigidity against deformation of the connecting part with the rotational axis in the other directions.

4. The stage apparatus according to claim 3,
wherein a surface of the connecting part coming in contact with the guide part has a shape longer in the second direction than in the third direction.

5. The stage apparatus according to claim 1,
wherein the upper table and the middle table use a ceramic composite material, and
the lower table uses a material of aluminum or an aluminum alloy.

6. The stage apparatus according to claim 5,
wherein the ceramic composite material contains aluminum as a matrix material.

7. The stage apparatus according to claim 1,
wherein the upper stage includes a driving unit configured to exert a driving force for moving the upper table in the first direction and that is fixed to the middle table,
the middle stage includes a guide part configured to guide the middle table in the second direction, and
the guide part is disposed within a range of a predetermined distance from the driving unit.

8. The stage apparatus according to claim 7,
wherein the guide part and the driving unit are arranged to be aligned in the first direction.

9. A charged particle beam apparatus comprising the stage apparatus according to claim 1.

10. The stage apparatus according to claim 5, further comprising a base portion supporting the lower table, the base portion formed of a same material as the lower table.

* * * * *